United States Patent
Elmala et al.

(10) Patent No.: US 11,303,250 B2
(45) Date of Patent: Apr. 12, 2022

(54) HIGH LINEARITY LOW NOISE AMPLIFIER

(71) Applicant: SHENZHEN GOODIX TECHNOLOGY CO., LTD., Shenzhen (CN)

(72) Inventors: Mostafa Elmala, San Diego, CA (US); Ahmed Emira, San Diego, CA (US); Mohamed Aboudina, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/988,705

(22) Filed: Aug. 9, 2020

(65) Prior Publication Data
US 2022/0045650 A1 Feb. 10, 2022

(51) Int. Cl.
*H03F 1/32* (2006.01)
*H03F 1/26* (2006.01)
*H03F 3/195* (2006.01)

(52) U.S. Cl.
CPC ............. *H03F 1/26* (2013.01); *H03F 3/195* (2013.01); *H03F 2200/294* (2013.01); *H03F 2200/372* (2013.01)

(58) Field of Classification Search
CPC ........................................................ H03F 1/32
USPC ................................................. 330/151, 149
See application file for complete search history.

(56) References Cited

U.S. PATENT DOCUMENTS

| | | | | |
|---|---|---|---|---|
| 4,446,441 A | * | 5/1984 | Fujibayashi | H03F 1/305 330/124 R |
| 7,187,234 B2 | * | 3/2007 | Cavers | H03F 1/3229 330/149 |
| 8,791,757 B2 | * | 7/2014 | Qiu | H03G 3/20 330/133 |
| 9,831,762 B2 | * | 11/2017 | Chepuri | H02M 3/158 |
| 2010/0301947 A1 | * | 12/2010 | Fujioka | H03F 1/0277 330/295 |
| 2020/0106394 A1 | | 4/2020 | Thoppay Egambaram et al. | |

* cited by examiner

*Primary Examiner* — Henry Choe
(74) *Attorney, Agent, or Firm* — Kilpatrick Townsend & Stockton LLP

(57) ABSTRACT

An amplifier circuit is disclosed. The amplifier circuit includes an input terminal configured to receive an input signal, an output terminal configured to transmit an output signal, and a first signal path including a first amplifying circuit, where the first amplifying circuit is configured to receive the input signal and to transmit a first amplified output to the output terminal, and where the first amplified output includes first amplifier circuit harmonic noise. The amplifier circuit also includes a second signal path including a second amplifying circuit, where the second amplifying circuit receives the input signal and transmits a second amplified output to the output terminal, and where the second amplified output includes second amplifier circuit harmonic noise. The output signal includes the first and second amplified outputs, and the first amplifying circuit harmonic noise is at least partially canceled by the second amplifying circuit harmonic noise in the output signal.

15 Claims, 6 Drawing Sheets

HIGH LINEARITY LOW NOISE AMPLIFIER

TECHNICAL FIELD

The subject matter described herein relates to a low-noise amplifier (LNA) circuit, and more particularly to an LNA circuit having improved linearity.

BACKGROUND

LNA circuits suffer from less than ideal linearity at least partly because of transistors having non-linear transconductance (gm). Circuit techniques to produce higher linearity outputs using non-linear transistors is needed in the art.

SUMMARY

One inventive aspect is an amplifier circuit. The amplifier circuit includes an input terminal configured to receive an input signal, an output terminal configured to transmit an output signal, and a first signal path including a first amplifying circuit, where the first amplifying circuit is configured to receive the input signal and to transmit a first amplified output to the output terminal, and where the first amplified output includes first amplifier circuit harmonic noise. The amplifier circuit also includes a second signal path including a second amplifying circuit, where the second amplifying circuit is configured to receive the input signal and to transmit a second amplified output to the output terminal, and where the second amplified output includes second amplifier circuit harmonic noise. The output signal includes the first and second amplified outputs, and where the first amplifying circuit harmonic noise is at least partially canceled by the second amplifying circuit harmonic noise in the output signal.

In some embodiments, the amplifier circuit also includes an input capacitor, configured to couple the input signal to each of the first and second signal paths.

In some embodiments, the amplifier circuit also includes an input capacitor, configured to couple the input signal to each of the first and second amplifying circuits.

In some embodiments, the first amplifying circuit includes a first inverting circuit, and the second amplifying circuit includes a second inverting circuit.

In some embodiments, the first inverting circuit includes a first inverter input, a first inverter output, and a first feedback component connected to the first inverter input and to the first inverter output, and the second inverting circuit includes a second inverter input, a second inverter output, and a second feedback component connected to the second inverter input and to the second inverter output.

In some embodiments, the first inverting circuit includes one or more first PMOS devices connected to the first inverter output, and one or more first NMOS devices connected to the first inverter output, and the second inverting circuit includes one or more second PMOS devices connected to the second inverter output, and one or more second NMOS devices connected to the second inverter output, where a transconductance per width of the first PMOS devices is different from a transconductance per width of the second PMOS devices, and where a transconductance per width of the first NMOS devices is different from a transconductance per width of the second NMOS devices.

In some embodiments, the first inverting circuit includes one or more first PMOS devices connected to the first inverter output, and one or more first NMOS devices connected to the first inverter output, and the second inverting circuit includes one or more second PMOS devices connected to the second inverter output, and one or more second NMOS devices connected to the second inverter output, where a voltage difference between the drain and source of the first PMOS devices is different from a voltage difference between the drain and source of the second PMOS devices, and where a voltage difference between the drain and source of the first NMOS devices is different from a voltage difference between the drain and source of the second NMOS devices.

In some embodiments, the first signal path includes a first output capacitor, where the first output capacitor is configured to couple the first amplified output to the output terminal, and the second signal path includes a second output capacitor, where the second output capacitor is configured to couple the second amplified output to the output terminal.

Another inventive aspect is a method of using an amplifier circuit. The method includes, with an input terminal, receiving an input signal, with an output terminal, transmitting an output signal, with a first amplifying circuit of a first signal path, receiving the input signal, and with the first amplifying circuit, transmitting a first amplified output to the output terminal, where the first amplified output includes first amplifier circuit harmonic noise. The method also includes, with a second amplifying circuit of a second signal path, receiving the input signal, and, with the second amplifying circuit, transmitting a second amplified output to the output terminal, where the second amplified output includes second amplifier circuit harmonic noise, where the output signal includes the first and second amplified outputs, and where the first amplifying circuit harmonic noise is at least partially canceled by the second amplifying circuit harmonic noise in the output signal.

In some embodiments, the method also includes, with an input capacitor, coupling the input signal to each of the first and second signal paths.

In some embodiments, the method also includes, with an input capacitor, coupling the input signal to each of the first and second amplifying circuits.

In some embodiments, the first amplifying circuit includes a first inverting circuit, and the second amplifying circuit includes a second inverting circuit.

In some embodiments, the first inverting circuit includes a first inverter input, a first inverter output, and a first feedback component connected to the first inverter input and to the first inverter output, and the second inverting circuit includes a second inverter input, a second inverter output, and a second feedback component connected to the second inverter input and to the second inverter output.

In some embodiments, the first inverting circuit includes one or more first PMOS devices connected to the first inverter output, and one or more first NMOS devices connected to the first inverter output, and the second inverting circuit includes one or more second PMOS devices connected to the second inverter output, and one or more second NMOS devices connected to the second inverter output, where a transconductance per width of the first PMOS devices is different from a transconductance per width of the second PMOS devices, and where a transconductance per width of the first NMOS devices is different from a transconductance per width of the second NMOS devices.

In some embodiments, the first inverting circuit includes one or more first PMOS devices connected to the first inverter output, and one or more first NMOS devices connected to the first inverter output, and the second inverting circuit includes one or more second PMOS devices connected to the second inverter output, and one or more second NMOS devices connected to the second inverter output, where a voltage difference between the drain and source of the first PMOS devices is different from a voltage difference between the drain and source of the second PMOS devices, and where a voltage difference between the drain and source of the first NMOS devices is different from a voltage difference between the drain and source of the second NMOS devices.

In some embodiments, the method also includes, with a first output capacitor of the first signal path, coupling the first amplified output to the output terminal, and with a second output capacitor of the second signal path, coupling the second amplified output to the output terminal.

Another inventive aspect is a receiver circuit. The receiver circuit includes a low noise amplifier circuit (LNA), including an input terminal configured to receive an input signal, an output terminal configured to transmit an output signal, and a first signal path including a first amplifying circuit, where the first amplifying circuit is configured to receive the input signal and to transmit a first amplified output to the output terminal, and where the first amplified output includes first amplifier circuit harmonic noise, a second signal path including a second amplifying circuit, where the second amplifying circuit is configured to receive the input signal and to transmit a second amplified output to the output terminal, and where the second amplified output includes second amplifier circuit harmonic noise, where the output signal includes the first and second amplified outputs, and where the first amplifying circuit harmonic noise is at least partially canceled by the second amplifying circuit harmonic noise in the output signal. The receiver circuit also includes an analog-to-digital converter (ADC) configured to receive an analog signal based on the output signal of the LNA, and to generate a digital signal based on the received analog signal, and a controller, configured to receive the digital signal.

In some embodiments, the first amplifying circuit includes a first inverting circuit, and the second amplifying circuit includes a second inverting circuit, where the first inverting circuit includes a first inverter input, a first inverter output, and a first feedback component connected to the first inverter input and to the first inverter output, and the second inverting circuit includes a second inverter input, a second inverter output, and a second feedback component connected to the second inverter input and to the second inverter output.

In some embodiments, the first inverting circuit includes one or more first PMOS devices connected to the first inverter output, and one or more first NMOS devices connected to the first inverter output, and the second inverting circuit includes one or more second PMOS devices connected to the second inverter output, and one or more second NMOS devices connected to the second inverter output. A transconductance per width of the first PMOS devices is different from a transconductance per width of the second PMOS devices, and a transconductance per width of the first NMOS devices is different from a transconductance per width of the second NMOS devices.

In some embodiments, the first inverting circuit includes one or more first PMOS devices connected to the first inverter output, and one or more first NMOS devices connected to the first inverter output, and the second inverting circuit includes one or more second PMOS devices connected to the second inverter output, and one or more second NMOS devices connected to the second inverter output, where a voltage difference between the drain and source of the first PMOS devices is different from a voltage difference between the drain and source of the second PMOS devices, and where a voltage difference between the drain and source of the first NMOS devices is different from a voltage difference between the drain and source of the second NMOS devices.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
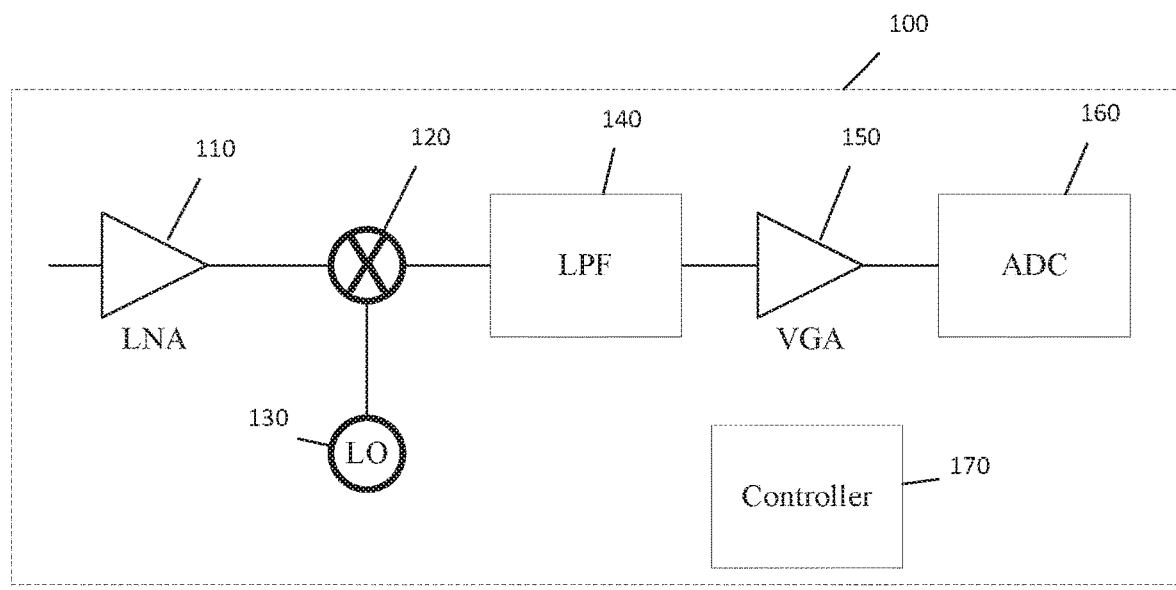
FIG. 1 is a schematic diagram of an embodiment of a receiver circuit having an LNA circuit.

Circuit features of LNA circuits having excellent linearity performance are described herein with reference to certain embodiments. Some of the features are illustrated in the figures. FIG. 1 illustrates a receiver circuit having an LNA circuit which may have one or more of the features resulting in high linearity performance. FIGS. 2-6 illustrate LNA circuits and their sub-circuits having one or more of the features resulting in high LNA linearity performance. FIG. 7 illustrates simulation results showing linearity improvements resulting from the various features discussed.

FIG. 1 is a schematic diagram of an embodiment of a receiver circuit 100 having an LNA circuit 110, which may have one or more of the features resulting in high linearity performance. Receiver circuit 100 also includes mixer 120 which receives an oscillator signal from oscillator (LO) 130, low-pass filter (LPF) 140, variable gain amplifier (VGA) 150, analog-to-digital converter (ADC) 160, and controller 170.

Low noise amplifier 110 is configured to receive a high frequency carrier signal at a carrier frequency and modulated with a low frequency information signal. The received signal may also include harmonic noise source signals at frequencies integer fractions (e.g. ½, ⅓) of the carrier frequency. Non-linearity of the LNA circuit 110 causes the output of the LNA 110 to have noise at the carrier frequency from the harmonic noise source signals. For example, a second harmonic of the harmonic noise source signal at ½ the carrier frequency occurs at the carrier frequency, and a third harmonic of the harmonic noise source signal at ⅓ the carrier frequency occurs at the carrier frequency. LNA circuit 110 has particularly high linearity, such that the noise occurring at the carrier frequency as a result of the received harmonic noise source signals is particularly low. Embodiments of LNA 110 and their various features causing high linearity are discussed below.

In response to the output from the low noise amplifier 110 and the oscillator signal, mixer 120 down converts the signal from the low noise amplifier 110. The resulting baseband signal includes information of the low frequency information signal and may include harmonic noise from the harmonic noise source signals.

The baseband signal is then filtered by the low-pass filter 140. Low-pass filter 140 may have any low pass filter topology and corresponding functionality known in the art.

The filtered baseband signal is then amplified by the variable gain amplifier 150. Variable gain amplifier 150 may have any variable gain amplifier topology and corresponding functionality known in the art.

The amplified baseband signal is then processed by the analog-to-digital converter 160. Variable gain amplifier 150 may have any variable gain amplifier topology and corresponding functionality known in the art.

As understood by those of skill in the art, using communication connectivity not illustrated in FIG. 1, control signals from controller 170 may control certain variable functionality of LNA 110, mixer 120 low-pass filter (LPF) 140, variable gain amplifier (VGA) 150, and analog-to-digital converter (ADC) 160.

For example, controller 170 cause one or more gain elements of receiver 100 to amplify or attenuate the high frequency or baseband signal. Additionally or alternatively, as understood by those of skill in the art, the control signals from controller 170 may cause one or more filtering elements to modify filtering of the high frequency or baseband signal by, for example, moving a pole of the one or more filtering elements.

Figure 2:
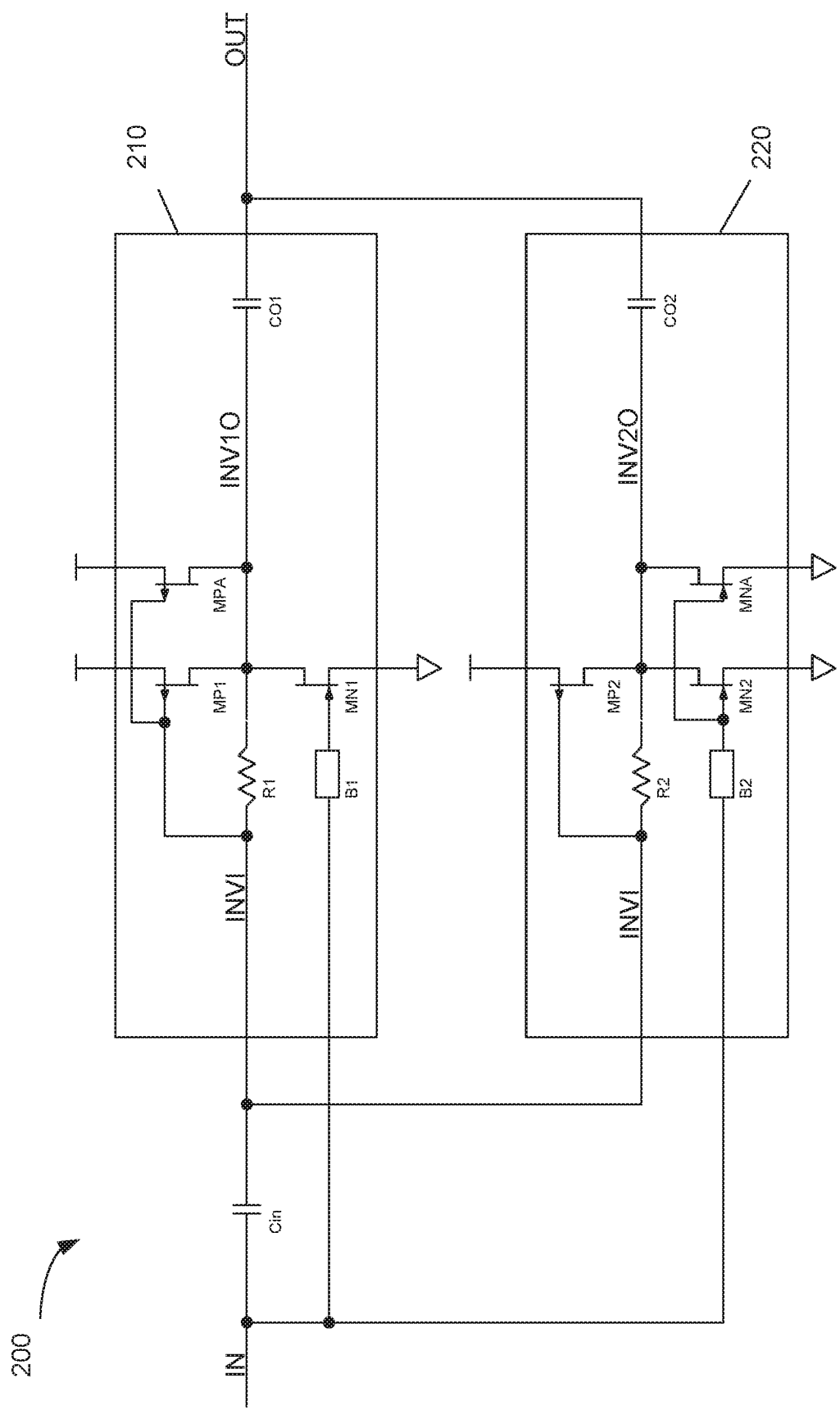
FIG. 2 is a schematic diagram of an embodiment of an LNA circuit.

FIG. 2 is a schematic diagram of an embodiment of an LNA circuit 200. LNA circuit 200 may be used as low noise amplifier 110 of FIG. 1. LNA circuit 200 may be used in other receiver circuits. LNA circuit 200 may be used in other circuits using LNA circuits. Other LNA circuits may be used as low noise amplifier 110 of FIG. 1. The other LNA circuits may have features similar or identical to features of LNA circuit 200.

LNA 200 includes input terminal IN, input capacitor Cin, first signal path 210, second signal path 220, and output terminal OUT.

Input IN receives an input signal. For example, input terminal IN may receive an RF input signal. LNA 200 generates an output signal at output terminal OUT based on the received input signal. The output signal may be an amplified or attenuated version of the input signal. In some embodiments, the amplification or attenuation is programmable.

The input signal has a carrier frequency and is modulated with a low frequency information signal. Accordingly, the input signal includes the information signal in a signal band at the carrier frequency. The input signal may also include harmonic noise source signals at frequencies integer fractions (e.g. ½, ⅓) of the carrier frequency. Non-linearity of the LNA circuit 200 causes the output signal to have noise at the carrier frequency from the harmonic noise source signals. For example, a second harmonic of the harmonic noise source signal at ½ the carrier frequency occurs at the carrier frequency, and a third harmonic of the harmonic noise source signal at ⅓ the carrier frequency occurs at the carrier frequency. LNA circuit 200 has particularly high linearity, such that the noise occurring at the carrier frequency as a result of the received harmonic noise source signals is particularly low.

The input signal at input terminal IN is coupled to both of the first signal path 210 and the second signal path 220 by input capacitor Cin. The first signal path 210 and the second signal path 220 cooperatively generate the output signal at output terminal OUT.

The first signal path 210 includes a first inverter comprising transistors MN1, MP1, and MPA, and N bias circuit B1. The first inverter is connected between a positive supply and a negative supply, and has an input at node INVI and an output at node INV1O. The first signal path 210 also includes resistor R1 connected to the input of the first inverter at node INVI and to the output of the first inverter at node INV1O. The first signal path 210 also includes capacitor CO1 connected to the output of the first inverter at node INV1O and to the output terminal OUT.

N bias circuit B1 may include a coupling capacitor having a first terminal connected to input terminal IN and a second terminal connected to the gate of transistor MN1. In addition, N bias circuit B1 may also include a gate bias voltage generator. For example, N bias circuit B1 may also include a gate bias voltage generator comprising a resistor connected to a fixed reference voltage and to the gate of transistor MN1. Alternatively, the gate bias voltage generator of N bias circuit B1 may include a voltage divider connected between the positive and negative power supplies and to the gate of transistor MN1, and configured to set a bias voltage at the gate of transistor MN1, as understood by those of skill in the art. In some embodiments, the voltage divider comprises first and second resistors, as understood by those of skill in the art. In some embodiments, the voltage divider comprises a current source and a diode connected N-type transistor, and the bias voltage at the gate of transistor MN1 is about equal to the threshold voltage of the N-type transistor, as understood by those of skill in the art. Other bias circuits may be used.

The second signal path 220 includes a second inverter comprising transistors MN2, MNA, and MP2, and N bias circuit B2. The second inverter is connected between the positive supply and the negative supply, and has an input at node INVI and an output at node INV2O. The second signal path 220 also includes resistor R2 connected to the input of the second inverter at node INVI and to the output of the second inverter at node INV2O. The second signal path 220 also includes capacitor CO2 connected to the output of the second inverter at node INV2O and to the output terminal OUT.

N bias circuit B2 may include a coupling capacitor having a first terminal connected to input terminal IN and a second terminal connected to the gate of transistors MN2 and MNA. In addition, N bias circuit B2 may also include a gate bias voltage generator. For example, N bias circuit B2 may also include a gate bias voltage generator comprising a resistor connected to a fixed reference voltage and to the gate of transistors MN2 and MNA. Alternatively, the gate bias voltage generator of N bias circuit B2 may include a voltage divider connected between the positive and negative power supplies and to the gates of transistors MN2 and MNA, and configured to set a bias voltage at the gates of transistors MN2 and MNA, as understood by those of skill in the art. In some embodiments, the voltage divider comprises first and second resistors, as understood by those of skill in the art. In some embodiments, the voltage divider comprises a current source and a diode connected N-type transistor, and the bias voltage at the gates of transistors MN2 and MNA is about equal to the threshold voltage of the N-type transistor, as understood by those of skill in the art. Other bias circuits may be used.

In some embodiments, N bias circuit B2 is schematically identical to N bias circuit B. In some embodiments, the N bias voltage at the gate of transistor MN1 is substantially identical to the N bias voltage at the gates of transistors MN2 and MNA. In some embodiments, N bias circuit B2 is not schematically identical to N bias circuit B1. In some embodiments, the N bias voltage at the gate of transistor MN1 is different from the N bias voltage at the gates of transistors MN2 and MNA.

In some embodiments, the sizes of transistors MP1 and MP2 are schematically identical, such that any difference between the sizes of transistors MP1 and MP2 is a result of layout differences and/or manufacturing variability. Similarly, the sizes of transistors MN1 and MN2 may be schematically identical.

Because of resistor R1, the output of the first inverter at node INV1O is biased at a first DC bias voltage. Because of resistor R2, the output of the second inverter at node INV2O is biased at a second DC bias voltage. The first DC bias voltage is the voltage occurring at the first inverter output at node INV1O which causes the current from the transistors MP1 and MPA to be equal to the current through transistor MN1 and resistors R1 and R2 while the gate of transistor MN1 is biased to an N bias voltage generated by N bias circuit B1. The second DC bias voltage is the voltage occurring at the second inverter output at node INV2O which causes the current from the transistor MP2 and from resistors R1 and R2 to be equal to the current through transistors MN2 and MNA while the gate of transistor MN2 is biased to an N bias voltage generated by N bias circuit B2.

In some embodiments, the values of resistors R1 and R2 are identical. In some embodiments, the values of resistors R1 and R2 are not identical.

Because the gates and sources of transistors MP1, MPA, and MP2 of the first and second inverters are respectively connected, the Vgs of transistors MP1, MPA, and MP2 are identical. In some embodiments, the gates and sources of transistors MN1, MN2, and MNA of the first and second inverters are respectively connected to substantially identical voltages, such that the Vgs of transistors MN1, MN2, and MNA may also be identical or substantially identical. Therefore, because of the additional transistors MPA and MNA, the first DC bias voltage at node INV1O is greater than the second DC bias voltage at node INV2O. Therefore, a bias current flows from the first inverter output at node INV1O to the second inverter output at node INV2O through resistors R1 and R2.

Input capacitor Cin receives the input signal of LNA circuit 200, and couples the input signal to the inputs of the first and second inverters at node INVI. In addition, bias circuit B1 couples the input signal to the gate of transistor MN1, and bias circuit B2 couples the input signal to the gates of transistors MN2 and MNA.

The signal at the input of the first and second inverters at node INVI has a DC value equal to a third DC bias voltage, where the third DC bias voltage is between the first and second DC bias voltages. In addition, the signal at the input of the first and second inverters at node INVI has frequency components corresponding with the frequency components of the input signal at input terminal IN. In some embodiments, the signals at the gates of transistors MN1, MN2, and MNA also have frequency components corresponding with the frequency components of the input signal at input terminal IN.

Furthermore, the signal at the input of the first and second inverters at node INVI may be attenuated, as compared with the input signal at input terminal IN, according to an attenuation caused by the capacitive coupling division of the signal at input terminal IN by parasitic or other capacitance at the input of the first inverter at node INVI. Furthermore, the signal at the input of the first and second inverters at node INVI may be attenuated, as compared with the input signal at input terminal IN, according to an attenuation caused by the first and second inverters.

The signal at the output of the first inverter at node INV1O has a DC value at the first DC bias voltage discussed above. In addition, the signal at the output of the first inverter at node INV1O has frequency components corresponding with or identical to the frequency components of the input signal at input terminal IN.

In addition, the signal at the output of the first inverter at node INV1O is attenuated or amplified, as compared with the input signal at the input of the first inverter at node INVI, according to an attenuation or amplification caused by the first inverter.

The signal at the output of the second inverter at node INV2O has a DC value at the second DC bias voltage discussed above. In addition, the signal at the output of the second inverter at node INV2O has frequency components corresponding with or identical to the frequency components of the input signal at input terminal IN.

In addition, the signal at the output of the second inverter at node INV2O is attenuated or amplified, as compared with the input signal at the input of the second inverter at node INVI, according to an attenuation or amplification caused by the second inverter.

At least because of nonlinearity in the transconductance (gm) of transistors MP1, MPA, and MN1, the signal at the output of the first inverter at node INV1O has harmonic components of the input signal at input terminal IN. For example, at least because of the nonlinearity of gm of the transistors MP1, MPA, and MN1, the signal at the output of the first inverter at node INV1O has harmonic components of the harmonic noise source signals of the input signal discussed above. Accordingly, the nonlinearity of the first signal path causes the signal at the output of the first inverter at node INV1O to have noise in the signal band at the carrier frequency. For example, the signal at the output of the first inverter at node INV1O is caused to have noise at the carrier frequency resulting from harmonics of the harmonic noise source signals at frequencies integer fractions (e.g. ½, ⅓) of the carrier frequency, as understood by those of skill in the art.

Similarly, at least because of nonlinearity in the transconductance (gm) of transistors MP2, MN2, and MNA, the signal at the output of the second inverter at node INV2O has harmonic components of the input signal at input terminal IN. For example, at least because of the nonlinearity of gm of the transistors MP2, MN2, and MNA, the signal at the output of the second inverter at node INV2O has harmonic components of the harmonic noise source signals of the input signal discussed above. Accordingly, the nonlinearity of the second signal path causes the signal at the output of the second inverter at node INV2O to have noise in the signal band at the carrier frequency. For example, the signal at the output of the second inverter at node INV2O is caused to have noise at the carrier frequency resulting from harmonics of the harmonic noise source signals at frequencies integer fractions (e.g. ½, ⅓) of the carrier frequency, as understood by those of skill in the art.

The signal at the output of the first inverter at node INV1O is coupled to the output terminal OUT by capacitor CO1, and the signal at the output of the second inverter at node INV2O is coupled to the output terminal OUT by capacitor CO2. Accordingly, the harmonic components of the harmonic noise source signals in the signal at the output of the first inverter at node INV1O are summed with the harmonic components of the harmonic noise source signals in the signal at the output of the second inverter at node INV2O in the signal at the output terminal OUT.

Because the first DC bias voltage at the output of the first inverter at node INV1O is different from the second DC bias voltage at the output of the second inverter at node INV2O, the drain to source voltage (Vds) of the MP1 and MPA transistors is different from the Vds of the MP2 transistor, and the Vds of the MN1 transistor is different from the Vds of the MN2 and MNA transistors. At least partly because of the different Vds voltages, the instantaneous transconductance per width values of the transistors MP1 and MPA of the first inverter are different than the corresponding instantaneous transconductance per width value of the transistor MP2 of the second inverter. In addition, at least partly because of the different Vds voltages, the instantaneous transconductance per width value of the transistor MN1 of the first inverter is different than the corresponding instantaneous transconductance per width value of the transistors MN2 and MNA of the second inverter.

In some embodiments, the bias voltage and sizes of the transistors MP1, MPA, and MN1 of the first inverter, and the bias voltage and sizes of the transistors MP2, MN2 and MNA of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistors MN2 and MNA of the second inverter. Similarly, in some embodiments, the bias voltage and sizes of the transistors MP1, MPA, and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MN1 of the first inverter is canceled or partially canceled by nonlinearity in the transconductance of transistor MP2 of the second inverter.

In some embodiments, the bias voltage and sizes of the transistors MP1, MPA, and MN1 of the first inverter, and the bias voltage and sizes of the transistors MP2, MN2 and MNA of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistors MN2 and MNA of the second inverter, and nonlinearity in the output signal at output node OUT that is caused by nonlinearity in the transconductance of transistor MN1 of the first inverter is canceled or partially canceled by nonlinearity in the transconductance of transistor MP2 of the second inverter.

In some embodiments, the bias voltage and sizes of the transistors MP1, MPA, and MN1 of the first inverter, and the bias voltage and sizes of the transistors MP2, MN2 and MNA of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistor MP2 of the second inverter. Similarly, in some embodiments, the bias voltage and sizes of the transistors MP1, MPA, and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MN1 of the first inverter is canceled or partially canceled by nonlinearity in the transconductance of transistors MN2 and MNA of the second inverter.

In some embodiments, the bias voltage and sizes of the transistors MP1, MPA, and MN1 of the first inverter, and the bias voltage and sizes of the transistors MP2, MN2 and MNA of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistor MP2 of the second inverter, and nonlinearity in the output signal at output node OUT that is caused by nonlinearity in the transconductance of transistor MN1 of the first inverter is canceled or partially canceled by nonlinearity in the transconductance of transistors MN2 and MNA of the second inverter.

Figure 3:
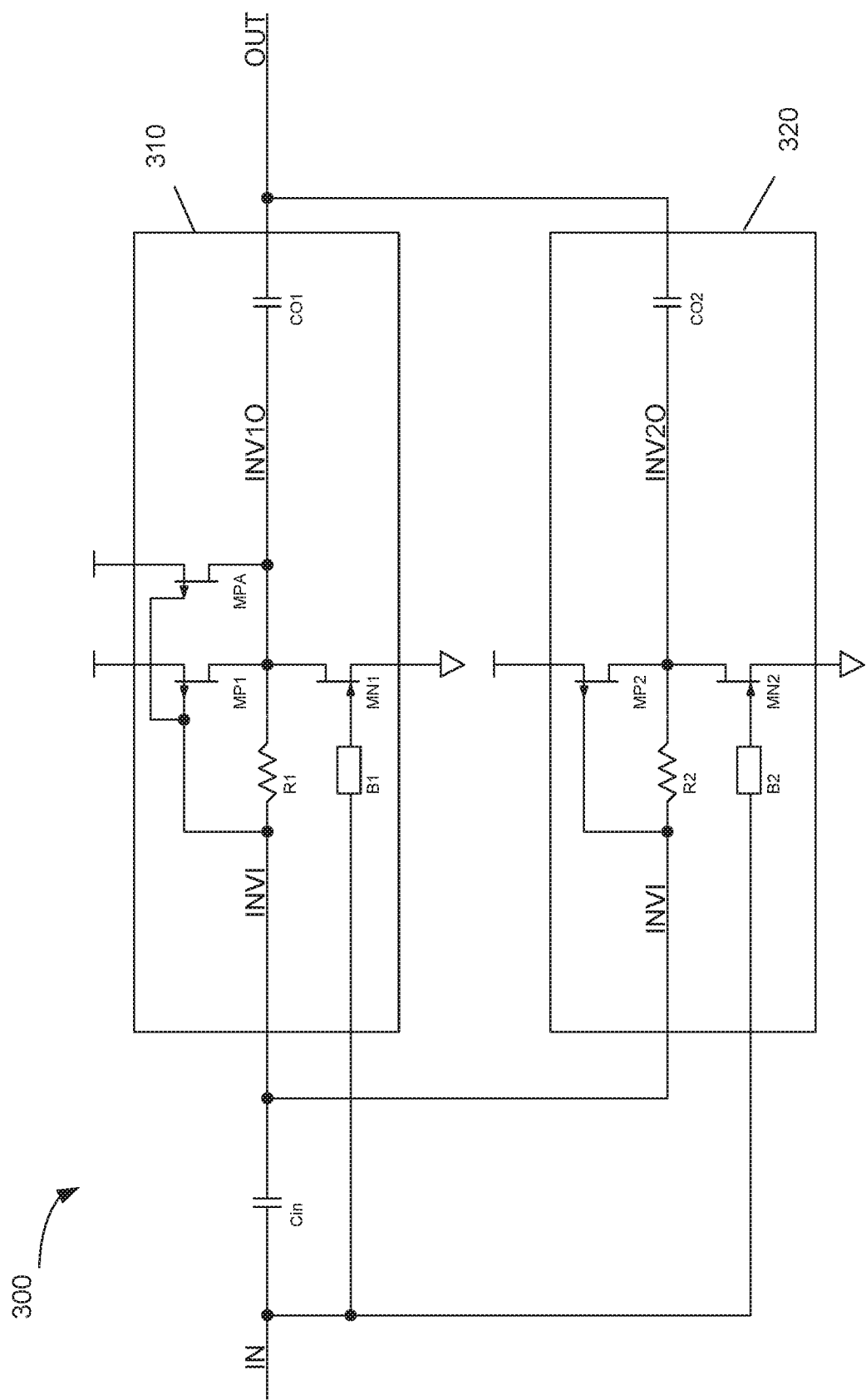
FIG. 3 is a schematic diagram of an embodiment of an LNA circuit.

FIG. 3 is a schematic diagram of an embodiment of an LNA circuit 300. LNA circuit 300 may be used as low noise amplifier 110 of FIG. 1. LNA circuit 300 may be used in other receiver circuits. LNA circuit 300 may be used in other circuits using LNA circuits. Other LNA circuits may be used as low noise amplifier 110 of FIG. 1. The other LNA circuits may have features similar or identical to features of LNA circuit 300.

LNA 300 includes input terminal IN, input capacitor Cin, first signal path 310, second signal path 320, and output terminal OUT.

Input IN receives an input signal. For example, input terminal IN may receive an RF input signal. LNA 300 generates an output signal at output terminal OUT based on the received input signal. The output signal may be an amplified or attenuated version of the input signal. In some embodiments, the amplification or attenuation is programmable.

The input signal has a carrier frequency and is modulated with a low frequency information signal. Accordingly, the input signal includes the information signal in a signal band at the carrier frequency. The input signal may also include harmonic noise source signals at frequencies integer fractions (e.g. ½, ⅓) of the carrier frequency. Non-linearity of the LNA circuit 300 causes the output signal to have noise at the carrier frequency from the harmonic noise source signals. For example, a second harmonic of the harmonic noise source signal at ½ the carrier frequency occurs at the carrier frequency, and a third harmonic of the harmonic noise source signal at ⅓ the carrier frequency occurs at the carrier frequency. LNA circuit 300 has particularly high linearity, such that the noise occurring at the carrier frequency as a result of the received harmonic noise source signals is particularly low.

The input signal at input terminal IN is coupled to both of the first signal path 310 and the second signal path 320 by input capacitor Cin. The first signal path 310 and the second signal path 320 cooperatively generate the output signal at output terminal OUT.

The first signal path 310 includes a first inverter comprising transistors MN1, MP1, and MPA, and N bias circuit B1. The first inverter is connected between a positive supply and a negative supply, and has an input at node INVI and an output at node INV1O. The first signal path 310 also includes resistor R1 connected to the input of the first inverter at node INVI and to the output of the first inverter at node INV1O. The first signal path 310 also includes capacitor CO1 connected to the output of the first inverter at node INV1O and to the output terminal OUT.

N bias circuit B1 may include a coupling capacitor having a first terminal connected to input terminal IN and a second terminal connected to the gate of transistor MN1. In addition, N bias circuit B1 may also include a gate bias voltage generator. For example, N bias circuit B1 may also include a gate bias voltage generator comprising a resistor connected to a fixed reference voltage and to the gate of transistor MN1. Alternatively, the gate bias voltage generator of N bias circuit B1 may include a voltage divider connected between the positive and negative power supplies and to the gate of transistor MN1, and configured to set a bias voltage at the gate of transistor MN1, as understood by those of skill in the art. In some embodiments, the voltage divider comprises first and second resistors, as understood by those of skill in the art. In some embodiments, the voltage divider comprises a current source and a diode connected N-type transistor, and the bias voltage at the gate of transistor MN1 is about equal to the threshold voltage of the N-type transistor, as understood by those of skill in the art. Other bias circuits may be used.

The second signal path 320 includes a second inverter comprising transistors MN2 and MP2, and N bias circuit B2. The second inverter is connected between the positive supply and the negative supply, and has an input at node INVI and an output at node INV2O. The second signal path 320 also includes resistor R2 connected to the input of the second inverter at node INVI and to the output of the second inverter at node INV2O. The second signal path 320 also includes capacitor CO2 connected to the output of the second inverter at node INV2O and to the output terminal OUT.

N bias circuit B2 may include a coupling capacitor having a first terminal connected to input terminal IN and a second terminal connected to the gate of transistor MN2. In addition, N bias circuit B2 may also include a gate bias voltage generator. For example, N bias circuit B2 may also include a gate bias voltage generator comprising a resistor connected to a fixed reference voltage and to the gate of transistor MN2. Alternatively, the gate bias voltage generator of N bias circuit B2 may include a voltage divider connected between the positive and negative power supplies and to the gate of transistor MN2, and configured to set a bias voltage at the gate of transistor MN2, as understood by those of skill in the art. In some embodiments, the voltage divider comprises first and second resistors, as understood by those of skill in the art. In some embodiments, the voltage divider comprises a current source and a diode connected N-type transistor, and the bias voltage at the gate of transistor MN2 is about equal to the threshold voltage of the N-type transistor, as understood by those of skill in the art. Other bias circuits may be used.

In some embodiments, N bias circuit B2 is schematically identical to N bias circuit B1. In some embodiments, the N bias voltage at the gate of transistor MN1 is substantially identical to the N bias voltage at the gate of transistor MN2. In some embodiments, N bias circuit B2 is not schematically identical to N bias circuit B1. In some embodiments, the N bias voltage at the gate of transistor MN1 is different from the N bias voltage at the gate of transistor MN2.

In some embodiments, the sizes of transistors MP1 and MP2 are schematically identical, such that any difference between the sizes of transistors MP1 and MP2 is a result of layout differences and/or manufacturing variability. Similarly, the sizes of transistors MN1 and MN2 may be schematically identical.

Because of resistor R1, the output of the first inverter at node INV1O is biased at a first DC bias voltage. Because of resistor R2, the output of the second inverter at node INV2O is biased at a second DC bias voltage. The first DC bias voltage is the voltage occurring at the first inverter output at node INV1O which causes the current from the transistors MP1 and MPA to be equal to the current through transistor MN1 and resistors R1 and R2 while the gate of transistor MN1 is biased to an N bias voltage generated by N bias circuit B1. The second DC bias voltage is the voltage occurring at the second inverter output at node INV2O which causes the current from the transistor MP2 and from resistors R1 and R2 to be equal to the current through transistor MN2 while the gate of transistor MN2 is biased to an N bias voltage generated by N bias circuit B2.

In some embodiments, the values of resistors R1 and R2 are identical. In some embodiments, the values of resistors R1 and R2 are not identical.

Because the gates and sources of transistors MP1, MPA, and MP2 of the first and second inverters are respectively connected, the Vgs of transistors MP1, MPA, and MP2 are identical. In some embodiments, the gates and sources of transistors MN1 and MN2 of the first and second inverters are respectively connected to substantially identical voltages, such that the Vgs of transistors MN1 and MN2 may also be identical or substantially identical. Therefore, because of the additional transistor MPA, the first DC bias voltage at node INV1O is greater than the second DC bias voltage at node INV2O. Therefore, a bias current flows from the first inverter output at node INV1O to the second inverter output at node INV2O through resistors R1 and R2.

Input capacitor Cin receives the input signal of LNA circuit 300, and couples the input signal to the inputs of the first and second inverters at node INVI. In addition, bias circuit B1 couples the input signal to the gate of transistor MN1, and bias circuit B2 couples the input signal to the gate of transistor MN2.

The signal at the input of the first and second inverters at node INVI has a DC value equal to a third DC bias voltage, where the third DC bias voltage is between the first and second DC bias voltages. In addition, the signal at the input of the first and second inverters at node INVI has frequency components corresponding with the frequency components of the input signal at input terminal IN. In some embodiments, the signals at the gates of transistors MN1 and MN2 also have frequency components corresponding with the frequency components of the input signal at input terminal IN.

Furthermore, the signal at the input of the first and second inverters at node INVI may be attenuated, as compared with the input signal at input terminal IN, according to an attenuation caused by the capacitive coupling division of the signal at input terminal IN by parasitic or other capacitance at the input of the first inverter at node INVI. Furthermore, the signal at the input of the first and second inverters at node INVI may be attenuated, as compared with the input signal at input terminal IN, according to an attenuation caused by the first and second inverters.

The signal at the output of the first inverter at node INV1O has a DC value at the first DC bias voltage discussed above. In addition, the signal at the output of the first inverter at node INV1O has frequency components corresponding with or identical to the frequency components of the input signal at input terminal IN.

In addition, the signal at the output of the first inverter at node INV1O is attenuated or amplified, as compared with the input signal at the input of the first inverter at node INVI, according to an attenuation or amplification caused by the first inverter.

The signal at the output of the second inverter at node INV2O has a DC value at the second DC bias voltage discussed above. In addition, the signal at the output of the second inverter at node INV2O has frequency components corresponding with or identical to the frequency components of the input signal at input terminal IN.

In addition, the signal at the output of the second inverter at node INV2O is attenuated or amplified, as compared with the input signal at the input of the second inverter at node INVI, according to an attenuation or amplification caused by the second inverter.

At least because of nonlinearity in the transconductance (gm) of transistors MP1, MPA, and MN1, the signal at the output of the first inverter at node INV1O has harmonic components of the input signal at input terminal IN. For example, at least because of the nonlinearity of gm of the transistors MP1, MPA, and MN1, the signal at the output of the first inverter at node INV1O has harmonic components of the harmonic noise source signals of the input signal discussed above. Accordingly, the nonlinearity of the first signal path causes the signal at the output of the first inverter at node INV1O to have noise in the signal band at the carrier frequency. For example, the signal at the output of the first inverter at node INV1O is caused to have noise at the carrier frequency resulting from harmonics of the harmonic noise source signals at frequencies integer fractions (e.g. ½, ⅓) of the carrier frequency, as understood by those of skill in the art.

Similarly, at least because of nonlinearity in the transconductance (gm) of transistors MP2 and MN2, the signal at the output of the second inverter at node INV2O has harmonic components of the input signal at input terminal IN. For example, at least because of the nonlinearity of gm of the transistors MP2 and MN2, the signal at the output of the second inverter at node INV2O has harmonic components of the harmonic noise source signals of the input signal discussed above. Accordingly, the nonlinearity of the second signal path causes the signal at the output of the second inverter at node INV2O to have noise in the signal band at the carrier frequency. For example, the signal at the output of the second inverter at node INV2O is caused to have noise at the carrier frequency resulting from harmonics of the harmonic noise source signals at frequencies integer fractions (e.g. ½, ⅓) of the carrier frequency, as understood by those of skill in the art.

The signal at the output of the first inverter at node INV1O is coupled to the output terminal OUT by capacitor CO1, and the signal at the output of the first inverter at node INV1O is coupled to the output terminal OUT by capacitor CO1. Accordingly, the harmonic components of the harmonic noise source signals in the signal at the output of the first inverter at node INV1O are summed with the harmonic components of the harmonic noise source signals in the signal at the output of the second inverter at node INV2O in the signal at the output terminal OUT.

Because the first DC bias voltage at the output of the first inverter at node INV1O is different from the second DC bias voltage at the output of the second inverter at node INV2O, the drain to source voltage (Vds) of the MP1 and MPA transistors is different from the Vds of the MP2 transistor, and the Vds of the MN1 transistor is different from the Vds of the MN2 transistor. At least partly because of the different Vds voltages, the instantaneous transconductance per width values of the transistors MP1 and MPA of the first inverter are different than the corresponding instantaneous transconductance per width value of the transistor MP2 of the second inverter. In addition, at least partly because of the different Vds voltages, the instantaneous transconductance per width value of the transistor MN1 of the first inverter is different than the corresponding instantaneous transconductance per width value of the transistor MN2 of the second inverter.

In some embodiments, the bias voltage and sizes of the transistors MP1, MPA, and MN1 of the first inverter, and the bias voltage and sizes of the transistors MP2 and MN2 of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistor MN2 of the second inverter. Similarly, in some embodiments, the bias voltage and sizes of the transistors MP1, MPA, and MN1 of the first inverter, and the bias voltage and sizes of the transistors MP2 and MN2 of the second inverter are selected such that the nonlinearity in the output signal at output node OUT that is caused by nonlinearity in the transconductance of transistor MN1 of the first inverter is canceled or partially canceled by nonlinearity in the transconductance of transistor MP2 of the second inverter.

In some embodiments, the bias voltage and sizes of the transistors MP1, MPA, and MN1 of the first inverter, and the bias voltage and sizes of the transistors MP2 and MN2 of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistor MN2 of the second inverter, and nonlinearity in the output signal at output node OUT that is caused by nonlinearity in the transconductance of transistor MN1 of the first inverter is canceled or partially canceled by nonlinearity in the transconductance of transistor MP2 of the second inverter.

In some embodiments, the bias voltage and sizes of the transistors MP1, MPA, and MN1 of the first inverter, and the bias voltage and sizes of the transistors MP2 and MN2 of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistor MP2 of the second inverter. Similarly, in some embodiments, the bias voltage and sizes of the transistors MP1, MPA, and MN1 of the first inverter, and the bias voltage and sizes of the transistors MP2 and MN2 of the second inverter are selected such that the nonlinearity in the output signal at output node OUT that is caused by nonlinearity in the transconductance of transistor MN1 of the first inverter is canceled or partially canceled by nonlinearity in the transconductance of transistor MN2 of the second inverter.

In some embodiments, the bias voltage and sizes of the transistors MP1, MPA, and MN1 of the first inverter, and the bias voltage and sizes of the transistors MP2 and MN2 of the second inverter are selected such that the nonlinearity in the output signal at output node OUT that is caused by nonlinearity in the transconductance of transistors MP1 and MPA of the first inverter is canceled or partially canceled by nonlinearity in the transconductance of transistor MP2 of the second inverter, and nonlinearity in the output signal at output node OUT that is caused by nonlinearity in the transconductance of transistor MN1 of the first inverter is canceled or partially canceled by nonlinearity in the transconductance of transistor MN2 of the second inverter.

Figure 4:
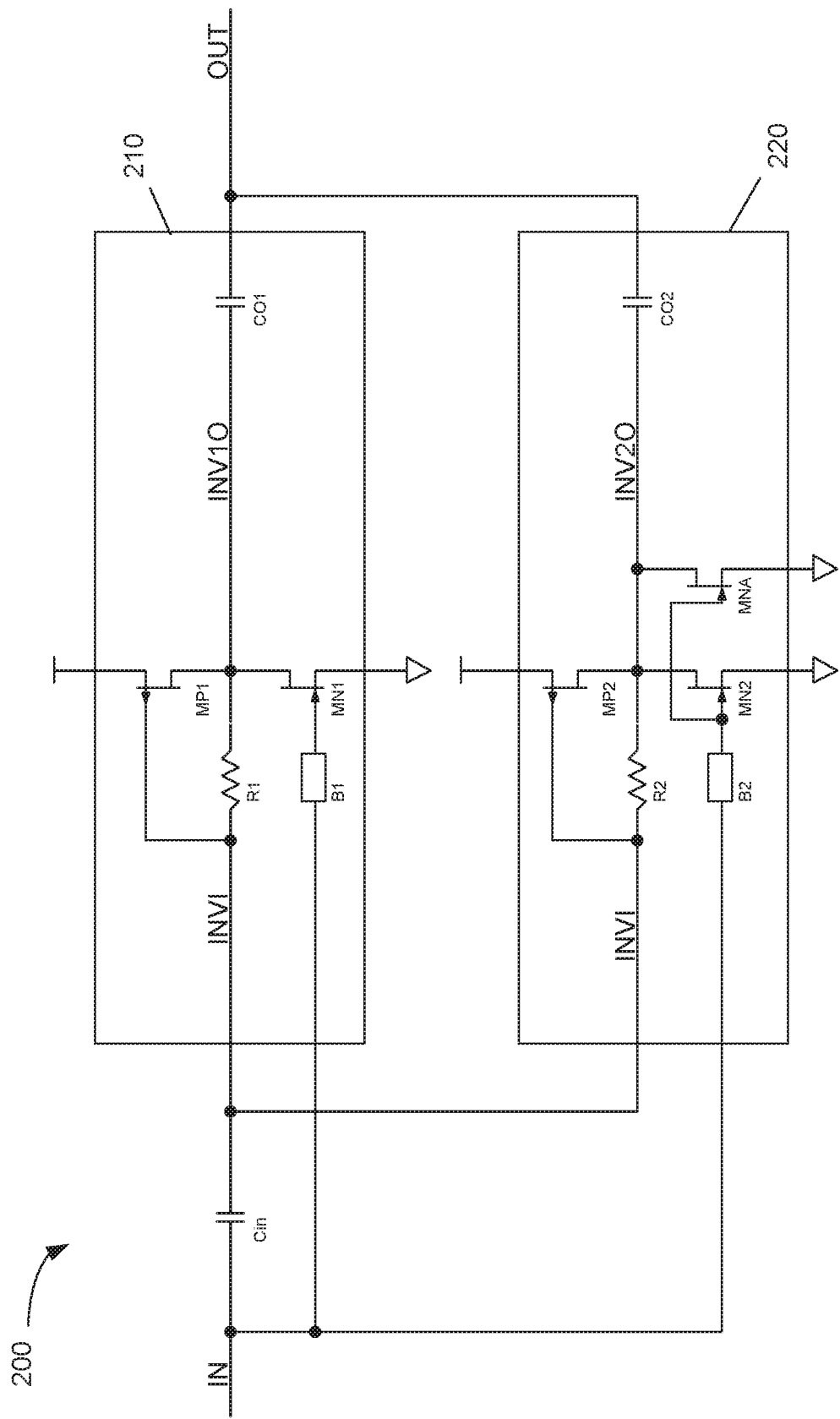
FIG. 4 is a schematic diagram of an embodiment of an LNA circuit.

FIG. 4 is a schematic diagram of an embodiment of an LNA circuit 400. LNA circuit 400 may be used as low noise amplifier 110 of FIG. 1. LNA circuit 400 may be used in other receiver circuits. LNA circuit 400 may be used in other circuits using LNA circuits. Other LNA circuits may be used as low noise amplifier 110 of FIG. 1. The other LNA circuits may have features similar or identical to features of LNA circuit 400.

LNA 400 includes input terminal IN, input capacitor Cin, first signal path 410, second signal path 420, and output terminal OUT.

Input IN receives an input signal. For example, input terminal IN may receive an RF input signal. LNA 400 generates an output signal at output terminal OUT based on the received input signal. The output signal may be an amplified or attenuated version of the input signal. In some embodiments, the amplification or attenuation is programmable.

The input signal has a carrier frequency and is modulated with a low frequency information signal. Accordingly, the input signal includes the information signal in a signal band at the carrier frequency. The input signal may also include harmonic noise source signals at frequencies integer fractions (e.g. ½, ⅓) of the carrier frequency. Non-linearity of the LNA circuit 400 causes the output signal to have noise at the carrier frequency from the harmonic noise source signals. For example, a second harmonic of the harmonic noise source signal at ½ the carrier frequency occurs at the carrier frequency, and a third harmonic of the harmonic noise source signal at ⅓ the carrier frequency occurs at the carrier frequency. LNA circuit 400 has particularly high linearity, such that the noise occurring at the carrier frequency as a result of the received harmonic noise source signals is particularly low.

The input signal at input terminal IN is coupled to both of the first signal path 410 and the second signal path 420 by input capacitor Cin. The first signal path 410 and the second signal path 420 cooperatively generate the output signal at output terminal OUT.

The first signal path 410 includes a first inverter comprising transistors MN1 and MP1, and N bias circuit B1. The first inverter is connected between a positive supply and a negative supply, and has an input at node INVI and an output at node INV1O. The first signal path 410 also includes resistor R1 connected to the input of the first inverter at node INVI and to the output of the first inverter at node INV1O. The first signal path 410 also includes capacitor CO1 connected to the output of the first inverter at node INV1O and to the output terminal OUT.

N bias circuit B1 may include a coupling capacitor having a first terminal connected to input terminal IN and a second terminal connected to the gate of transistor MN1. In addition, N bias circuit B1 may also include a gate bias voltage generator. For example, N bias circuit B1 may also include a gate bias voltage generator comprising a resistor connected to a fixed reference voltage and to the gate of transistor MN1. Alternatively, the gate bias voltage generator of N bias circuit B1 may include a voltage divider connected between the positive and negative power supplies and to the gate of transistor MN1, and configured to set a bias voltage at the gate of transistor MN1, as understood by those of skill in the art. In some embodiments, the voltage divider comprises first and second resistors, as understood by those of skill in the art. In some embodiments, the voltage divider comprises a current source and a diode connected N-type transistor, and the bias voltage at the gate of transistor MN1 is about equal to the threshold voltage of the N-type transistor, as understood by those of skill in the art. Other bias circuits may be used.

The second signal path 420 includes a second inverter comprising transistors MN2, MNA, and MP2, and N bias circuit B2. The second inverter is connected between the positive supply and the negative supply, and has an input at node INVI and an output at node INV2O. The second signal path 420 also includes resistor R2 connected to the input of the second inverter at node INVI and to the output of the second inverter at node INV2O. The second signal path 420 also includes capacitor CO2 connected to the output of the second inverter at node INV2O and to the output terminal OUT.

N bias circuit B2 may include a coupling capacitor having a first terminal connected to input terminal IN and a second terminal connected to the gate of transistors MN2 and MNA. In addition, N bias circuit B2 may also include a gate bias voltage generator. For example, N bias circuit B2 may also include a gate bias voltage generator comprising a resistor connected to a fixed reference voltage and to the gate of transistors MN2 and MNA. Alternatively, the gate bias voltage generator of N bias circuit B2 may include a voltage divider connected between the positive and negative power supplies and to the gates of transistors MN2 and MNA, and configured to set a bias voltage at the gates of transistors MN2 and MNA, as understood by those of skill in the art. In some embodiments, the voltage divider comprises first and second resistors, as understood by those of skill in the art. In some embodiments, the voltage divider comprises a current source and a diode connected N-type transistor, and the bias voltage at the gates of transistors MN2 and MNA is about equal to the threshold voltage of the N-type transistor, as understood by those of skill in the art. Other bias circuits may be used.

In some embodiments, N bias circuit B2 is schematically identical to N bias circuit B1. In some embodiments, the N bias voltage at the gate of transistor MN1 is substantially identical to the N bias voltage at the gates of transistors MN2 and MNA. In some embodiments, N bias circuit B2 is not schematically identical to N bias circuit B1. In some embodiments, the N bias voltage at the gate of transistor MN1 is different from the N bias voltage at the gates of transistors MN2 and MNA.

In some embodiments, the sizes of transistors MP1 and MP2 are schematically identical, such that any difference between the sizes of transistors MP1 and MP2 is a result of layout differences and/or manufacturing variability. Similarly, the sizes of transistors MN1 and MN2 may be schematically identical.

Because of resistor R1, the output of the first inverter at node INV1O is biased at a first DC bias voltage. Because of resistor R2, the output of the second inverter at node INV2O is biased at a second DC bias voltage. The first DC bias voltage is the voltage occurring at the first inverter output at node INV1O which causes the current from the transistor MP1 to be equal to the current through transistor MN1 and resistors R1 and R2 while the gate of transistor MN1 is biased to an N bias voltage generated by N bias circuit B1. The second DC bias voltage is the voltage occurring at the second inverter output at node INV2O which causes the current from the transistor MP2 and from resistors R1 and R2 to be equal to the current through transistors MN2 and MNA while the gate of transistor MN2 is biased to an N bias voltage generated by N bias circuit B2.

In some embodiments, the values of resistors R1 and R2 are identical. In some embodiments, the values of resistors R1 and R2 are not identical.

Because the gates and sources of transistors MP1 and MP2 of the first and second inverters are respectively connected, the Vgs of transistors MP1 and MP2 are identical. In some embodiments, the gates and sources of transistors MN1, MN2, and MNA of the first and second inverters are respectively connected to substantially identical voltages, such that the Vgs of transistors MN1, MN2, and MNA may also be identical or substantially identical. Therefore, because of the additional transistor MNA, the first DC bias voltage at node INV1O is greater than the second DC bias voltage at node INV2O. Therefore, a bias current flows from the first inverter output at node INV1O to the second inverter output at node INV2O through resistors R1 and R2.

Input capacitor Cin receives the input signal of LNA circuit 200, and couples the input signal to the inputs of the first and second inverters at node INVI. In addition, bias circuit B1 couples the input signal to the gate of transistor MN1, and bias circuit B2 couples the input signal to the gates of transistors MN2 and MNA.

The signal at the input of the first and second inverters at node INVI has a DC value equal to a third DC bias voltage, where the third DC bias voltage is between the first and second DC bias voltages. In addition, the signal at the input of the first and second inverters at node INVI has frequency components corresponding with the frequency components of the input signal at input terminal IN. In some embodiments, the signals at the gates of transistors MN1, MN2, and MNA also have frequency components corresponding with the frequency components of the input signal at input terminal IN.

Furthermore, the signal at the input of the first and second inverters at node INVI may be attenuated, as compared with the input signal at input terminal IN, according to an attenuation caused by the capacitive coupling division of the signal at input terminal IN by parasitic or other capacitance at the input of the first inverter at node INVI. Furthermore, the signal at the input of the first and second inverters at node INVI may be attenuated, as compared with the input signal at input terminal IN, according to an attenuation caused by the first and second inverters.

The signal at the output of the first inverter at node INV1O has a DC value at the first DC bias voltage discussed above. In addition, the signal at the output of the first inverter at node INV1O has frequency components corresponding with or identical to the frequency components of the input signal at input terminal IN.

In addition, the signal at the output of the first inverter at node INV1O is attenuated or amplified, as compared with the input signal at the input of the first inverter at node INVI, according to an attenuation or amplification caused by the first inverter.

The signal at the output of the second inverter at node INV2O has a DC value at the second DC bias voltage discussed above. In addition, the signal at the output of the second inverter at node INV2O has frequency components corresponding with or identical to the frequency components of the input signal at input terminal IN.

In addition, the signal at the output of the second inverter at node INV2O is attenuated or amplified, as compared with the input signal at the input of the second inverter at node INVI, according to an attenuation or amplification caused by the second inverter.

At least because of nonlinearity in the transconductance (gm) of transistors MP1, and MN1, the signal at the output of the first inverter at node INV1O has harmonic components of the input signal at input terminal IN. For example, at least because of the nonlinearity of gm of the transistors MP1 and MN1, the signal at the output of the first inverter at node INV1O has harmonic components of the harmonic noise source signals of the input signal discussed above. Accordingly, the nonlinearity of the first signal path causes the signal at the output of the first inverter at node INV1O to have noise in the signal band at the carrier frequency. For example, the signal at the output of the first inverter at node INV1O is caused to have noise at the carrier frequency resulting from harmonics of the harmonic noise source signals at frequencies integer fractions (e.g. ½, ⅓) of the carrier frequency, as understood by those of skill in the art.

Similarly, at least because of nonlinearity in the transconductance (gm) of transistors MP2, MN2, and MNA, the signal at the output of the second inverter at node INV2O has harmonic components of the input signal at input terminal IN. For example, at least because of the nonlinearity of gm of the transistors MP2, MN2, and MNA, the signal at the output of the second inverter at node INV2O has harmonic components of the harmonic noise source signals of the input signal discussed above. Accordingly, the nonlinearity of the second signal path causes the signal at the output of the second inverter at node INV2O to have noise in the signal band at the carrier frequency. For example, the signal at the output of the second inverter at node INV2O is caused to have noise at the carrier frequency resulting from harmonics of the harmonic noise source signals at frequencies integer fractions (e.g. ½, ⅓) of the carrier frequency, as understood by those of skill in the art.

The signal at the output of the first inverter at node INV1O is coupled to the output terminal OUT by capacitor CO1, and the signal at the output of the first inverter at node INV1O is coupled to the output terminal OUT by capacitor CO1. Accordingly, the harmonic components of the harmonic noise source signals in the signal at the output of the first inverter at node INV1O are summed with the harmonic components of the harmonic noise source signals in the signal at the output of the second inverter at node INV2O in the signal at the output terminal OUT.

Because the first DC bias voltage at the output of the first inverter at node INV1O is different from the second DC bias voltage at the output of the second inverter at node INV2O, the drain to source voltage (Vds) of the MP1 transistor is different from the Vds of the MP2 transistor, and the Vds of the MN1 transistor is different from the Vds of the MN2 and MNA transistors. At least partly because of the different Vds voltages, the instantaneous transconductance per width value of the transistor MP1 of the first inverter is different than the corresponding instantaneous transconductance per width value of the transistor MP2 of the second inverter. In addition, at least partly because of the different Vds voltages, the instantaneous transconductance per width value of the transistor MN1 of the first inverter is different than the corresponding instantaneous transconductance per width value of the transistors MN2 and MNA of the second inverter.

In some embodiments, the bias voltage and sizes of the transistors MP1 and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MP1 of the first inverter is canceled or partially canceled by nonlinearity in the transconductance of transistors MN2 and MNA of the second inverter. Similarly, in some embodiments, the bias voltage and sizes of the transistors MP1 and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MN1 of the first inverter is canceled or partially canceled by nonlinearity in the transconductance of transistor MP2 of the second inverter.

In some embodiments, the bias voltage and sizes of the transistors MP1 and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MP1 of the first inverter is canceled or partially canceled by nonlinearity in the transconductance of transistors MN2 and MNA of the second inverter, and nonlinearity in the output signal at output node OUT that is caused by nonlinearity in the transconductance of transistor MN1 of the first inverter is canceled or partially canceled by nonlinearity in the transconductance of transistor MP2 of the second inverter.

In some embodiments, the bias voltage and sizes of the transistors MP1 and MN1 of the first inverter, and the bias voltage and sizes of the transistors MP2, MN2 and MNA of the second inverter are selected such that the nonlinearity in the output signal at output node OUT that is caused by nonlinearity in the transconductance of transistors MP1 of the first inverter is canceled or partially canceled by nonlinearity in the transconductance of transistor MP2 of the second inverter. Similarly, in some embodiments, the bias voltage and sizes of the transistors MP1 and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MN1 of the first inverter is canceled or partially canceled by nonlinearity in the transconductance of transistors MN2 and MNA of the second inverter.

In some embodiments, the bias voltage and sizes of the transistors MP1 and MN1 of the first inverter, and the bias voltage and sizes of the transistors MP2, MN2 and MNA of the second inverter are selected such that the nonlinearity in the output signal at output node OUT that is caused by nonlinearity in the transconductance of transistor MP1 of the first inverter is canceled or partially canceled by nonlinearity in the transconductance of transistor MP2 of the second inverter, and nonlinearity in the output signal at output node OUT that is caused by nonlinearity in the transconductance of transistor MN1 of the first inverter is canceled or partially canceled by nonlinearity in the transconductance of transistors MN2 and MNA of the second inverter.

Figure 5:
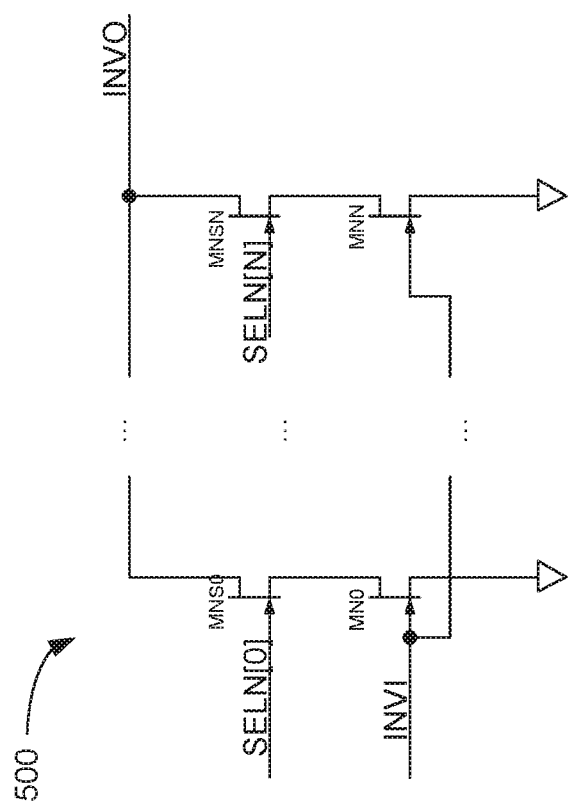
FIG. 5 is a schematic illustration of a programmable NMOS block.

FIG. 5 is a schematic illustration of a programmable NMOS block 500 which can be used as any of the NMOS transistors MN1, MNA, and MN2 of LNA circuits 200, 300, or 400 of FIGS. 2, 3, and 4. When used as any of NMOS transistors MN1, MNA, and MN2 of LNA circuits 200, 300, or 400, in addition to the features discussed elsewhere herein, the NMOS transistors MN1, MNA, and MN2 that programmable NMOS block 500 is used as, are also programmable. In some embodiments, MN1 and MN2 of LNA circuit 200, 300, or 400 are both programmable. In some embodiments, MNA is programmable. In some embodiments, MN1, MNA, and MN2 of LNA circuit 200, 300, or 400 are each programmable. In some embodiments, MNA of LNA circuit 200, 300, or 400 is not programmable. In some embodiments, MN1, MNA, and MN2 of LNA circuit 200, 300, or 400 are not programmable.

Programmable NMOS block 500 includes inverter transistors MN0-MNN and select transistors MNS0-MNSN. Inverter transistors MN0-MNN and select transistors MNS0-MNSN are connected in serial pairs, as illustrated, between ground and the output of the inverter of which they are a component. There may be any number N of serial pairs. In some embodiments, all pairs have the same size inverter transistor. In some embodiments, all pairs have the same size select transistor. In some embodiments, the sizes of the inverter transistors MN0-MNN are binarily weighted, such that each pair has a different size inverter transistor. In some embodiments, the sizes of the select transistors MNS0-MNSN are binarily weighted, such that each pair has a different size select transistor.

In some embodiments, the inverter transistors MN0-MNN and select transistors MNS0-MNSN are connected in serial pairs, in reverse order as that illustrated, between ground and the output of the inverter of which they are a component.

As illustrated, the gates of the inverter transistors MN0-MNN are connected to the input INVI of the inverter of which they are a component. The gates of the select transistors MNS0-MNSN are each connected to a control signal SELN[0]-SELN[N] from a controller (not shown) that selectively causes the conductivity of the pair of which they are a part to be controlled by the input of the inverter of which they are a component. In addition, the drains of the select transistors MNS0-MNSN are each connected to the output INVO of the inverter of which they are a component.

To program the NMOS block 500, the controller selectively causes a selected number of the select transistors MNS0-MNSN to be conductive by driving appropriate gate control signals to the gates of the select transistors MNS0-MNSN, as understood by those of skill in the art.

Figure 6:
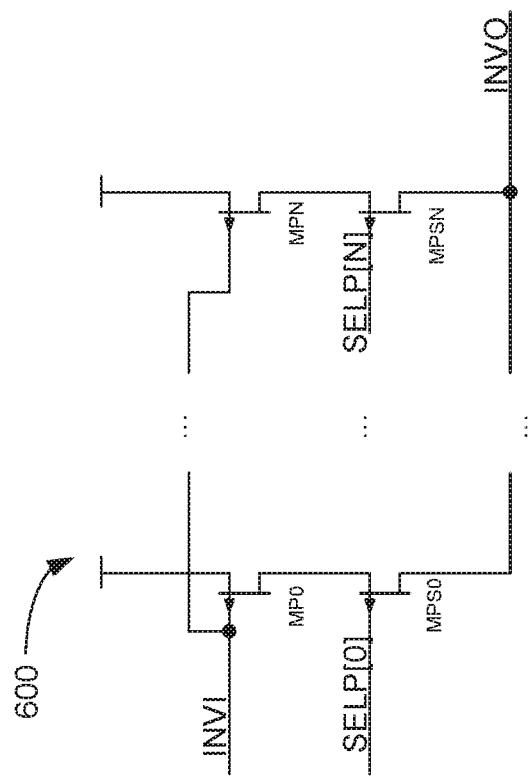
FIG. 6 is a schematic illustration of a programmable PMOS block.
Figure 7:
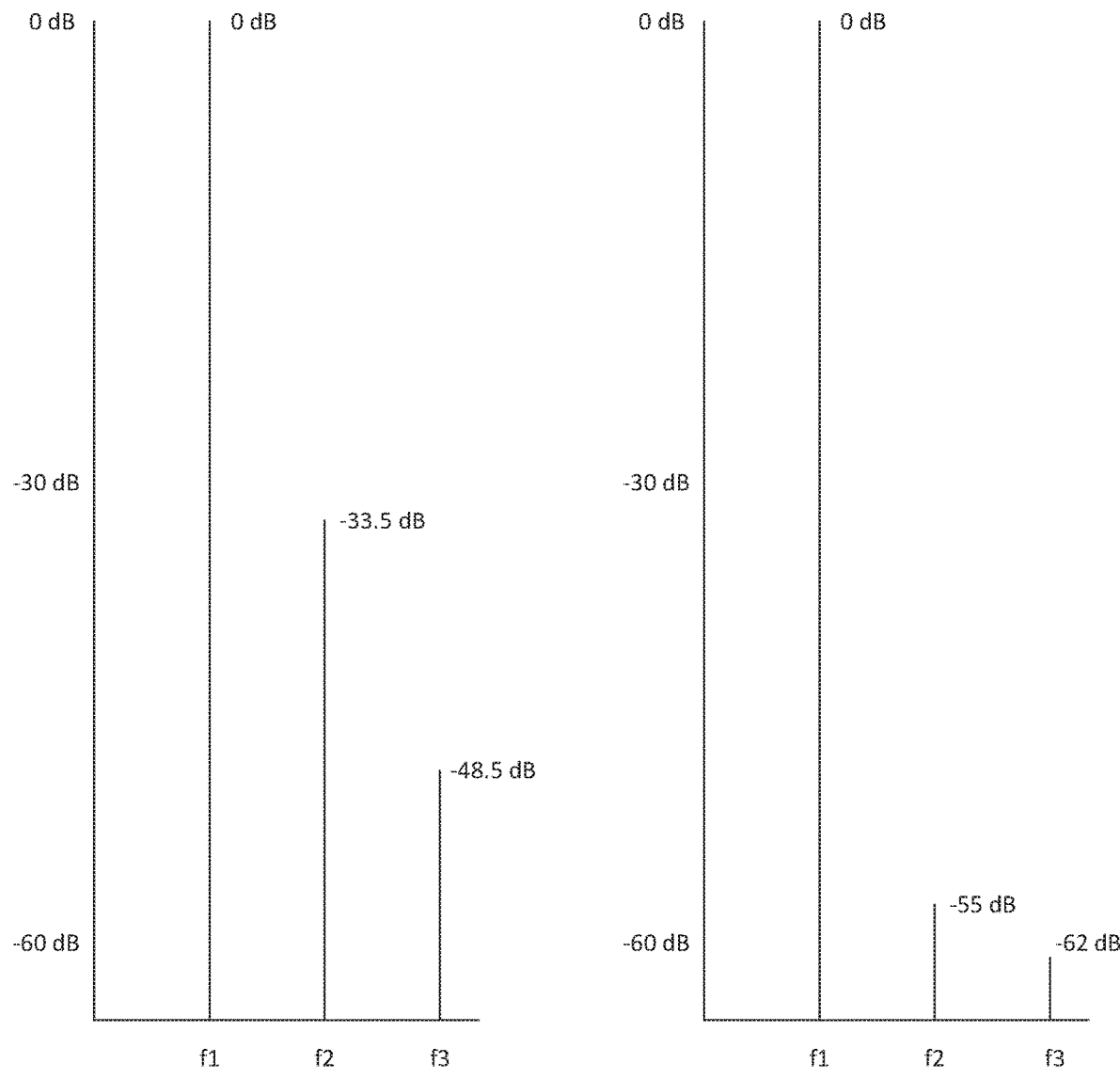
FIG. 7 is graph showing simulation results of the LNA circuit of FIG. 2 with and without the additional transistors MPA and MNA.

FIG. 6 is a schematic illustration of a programmable PMOS block 600 which can be used as any of the PMOS transistors MP1, MPA, and MP2 of LNA circuits 200, 300, or 400 of FIGS. 2, 3, and 4. When used as any of PMOS transistors MP1, MPA, and MP2 of LNA circuits 200, 300, or 400, in addition to the features discussed elsewhere herein, the PMOS transistors MP1, MPA, and MP2 that programmable PMOS block 600 is used as, are also programmable. In some embodiments, MP1 and MP2 of LNA circuit 200, 300, or 400 are both programmable. In some embodiments, MPA is programmable. In some embodiments, MP1, MPA, and MP2 of LNA circuit 200, 300, or 400 are each programmable. In some embodiments, MPA of LNA circuit 200, 300, or 400 is not programmable. In some embodiments, MP1, MPA, and MP2 of LNA circuit 200, 300, or 400 are not programmable.

Programmable PMOS block 600 includes inverter transistors MP0-MPN and select transistors MPS0-MPSN. Inverter transistors MP0-MPN and select transistors MPS0-MPSN are connected in serial pairs, as illustrated, between power and the output of the inverter of which they are a component. There may be any number N of serial pairs. In some embodiments, all pairs have the same size inverter transistor. In some embodiments, all pairs have the same size select transistor. In some embodiments, the sizes of the inverter transistors MP0-MPN are binarily weighted, such that each pair has a different size inverter transistor. In some embodiments, the sizes of the select transistors MPS0-MPSN are binarily weighted, such that each pair has a different size select transistor.

In some embodiments, the inverter transistors MP0-MPN and select transistors MPS0-MPSN are connected in serial pairs, in reverse order as that illustrated, between power and the output of the inverter of which they are a component.

As illustrated, the gates of the inverter transistors MP0-MPN are connected to the input INVI of the inverter of which they are a component. The gates of the select transistors MPS0-MPSN are each connected to a control signal SELP[0]-SELP[N] from a controller (not shown) that selectively causes the conductivity of the pair of which they are a part to be controlled by the input of the inverter of which they are a component. In addition, the drains of the select transistors MPS0-MPSN are each connected to the output INVO of the inverter of which they are a component.

To program the PMOS block 600, the controller selectively causes a selected number of the select transistors MPS0-MPSN to be conductive by driving appropriate gate control signals to the gates of the select transistors MPS0-MPSN, as understood by those of skill in the art.

FIG. 7 is graph showing simulation results of the LNA circuit 200 of FIG. 2 with and without the additional transistors MPA and MNA.

As shown, the second and third harmonics are significantly higher in the simulation without the MPA and MNA transistors than in the simulation with MPA and MNA transistors.

The table below shows the simulation results and the harmonic distortion improvement of the LNA circuit 200 with the MPA and MNA transistors at typical simulation conditions.

| Simulation Results | Without transistors MPA and MNA with respect to the fundamental signal (dB) | With transistors MPA and MNA with respect to the fundamental signal (dB) | Improvement (dB) |
| --- | --- | --- | --- |
| $2^{nd}$ Harmonic | −33.5 | −57 | 21.5 |
| $3^{rd}$ Harmonic | −48.5 | −69 | 13.5 |
| $4^{th}$ Harmonic | −56.5 | −78 | 21.5 |

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An amplifier circuit, comprising:
an input terminal configured to receive an input signal;
an output terminal configured to transmit an output signal;
a first signal path comprising a first amplifying circuit, wherein the first amplifying circuit is configured to receive the input signal via a first inverter input and to transmit a first amplified output via a first inverter output to the output terminal, a first feedback component is coupled between the first inverter input and the first inverter output, and the first amplified output includes first amplifier circuit harmonic noise; and
a second signal path comprising a second amplifying circuit, wherein the second amplifying circuit is configured to receive the input signal via a second inverter input and to transmit a second amplified output via a second inverter output to the output terminal, a second feedback component is coupled between the second inverter input and the second inverter output, and the second amplified output includes second amplifier circuit harmonic noise,
wherein the output signal comprises the first and second amplified outputs, and wherein the first amplifying circuit harmonic noise is at least partially canceled by the second amplifying circuit harmonic noise in the output signal.

2. The amplifier circuit of claim 1, further comprising an input capacitor, configured to couple the input signal to each of the first and second signal paths.

3. The amplifier circuit of claim 1, further comprising an input capacitor, configured to couple the input signal to each of the first and second amplifying circuits.

4. The amplifier circuit of claim 1, wherein:
one or more first PMOS devices connected to the first inverter output; and
one or more first NMOS devices connected to the first inverter output;
one or more second PMOS devices connected to the second inverter output;
one or more second NMOS devices connected to the second inverter output;
a transconductance per width of the first PMOS devices is different from a transconductance per width of the second PMOS devices; and
a transconductance per width of the first NMOS devices is different from a transconductance per width of the second NMOS devices.

5. The amplifier circuit of claim 1, wherein:
one or more first PMOS devices connected to the first inverter output; and
one or more first NMOS devices connected to the first inverter output;
one or more second PMOS devices connected to the second inverter output;
one or more second NMOS devices connected to the second inverter output;
a voltage difference between the drain and source of the first PMOS devices is different from a voltage difference between the drain and source of the second PMOS devices; and
a voltage difference between the drain and source of the first NMOS devices is different from a voltage difference between the drain and source of the second NMOS devices.

6. The amplifier circuit of claim 1, wherein:
the first signal path comprises a first output capacitor, wherein the first output capacitor is configured to couple the first amplified output to the output terminal; and
the second signal path comprises a second output capacitor, wherein the second output capacitor is configured to couple the second amplified output to the output terminal.

7. A method of using an amplifier circuit, the method comprising:
with a first inverter input of a first amplifying circuit of a first signal path, receiving an input signal;
with a first inverter output of the first amplifying circuit, transmitting a first amplified output to an output terminal, wherein a first feedback component is coupled between the first inverter input and the first inverter output, and the first amplified output includes first amplifier circuit harmonic noise;
with a second inverter input of a second amplifying circuit of a second signal path, receiving the input signal;
with a second inverter output of the second amplifying circuit, transmitting a second amplified output to the output terminal, wherein a second feedback component is coupled between the second inverter input and the second inverter output, and the second amplified output includes second amplifier circuit harmonic noise;
wherein the output signal comprises the first and second amplified outputs, and wherein the first amplifying circuit harmonic noise is at least partially canceled by the second amplifying circuit harmonic noise in the output signal.

8. The method of claim 7, further comprising, with an input capacitor, coupling the input signal to each of the first and second signal paths.

9. The method of claim 7, further comprising, with an input capacitor, coupling the input signal to each of the first and second amplifying circuits.

10. The method of claim 7, wherein:
one or more first PMOS devices is connected to the first inverter output;
one or more first NMOS devices is connected to the first inverter output;
one or more second PMOS devices is connected to the second inverter output;
one or more second NMOS devices is connected to the second inverter output;
a transconductance per width of the first PMOS devices is different from a transconductance per width of the second PMOS devices; and
a transconductance per width of the first NMOS devices is different from a transconductance per width of the second NMOS devices.

11. The method of claim 7, wherein:
one or more first PMOS devices connected to the first inverter output;
one or more first NMOS devices connected to the first inverter output;
one or more second PMOS devices connected to the second inverter output;
one or more second NMOS devices connected to the second inverter output;
a voltage difference between the drain and source of the first PMOS devices is different from a voltage difference between the drain and source of the second PMOS devices; and
a voltage difference between the drain and source of the first NMOS devices is different from a voltage difference between the drain and source of the second NMOS devices.

12. The method of claim 7, further comprising:
with a first output capacitor of the first signal path, coupling the first amplified output to the output terminal; and
with a second output capacitor of the second signal path, coupling the second amplified output to the output terminal.

13. A receiver circuit, comprising:
a low noise amplifier circuit (LNA), comprising:
an input terminal configured to receive an input signal,
an output terminal configured to transmit an output signal,
a first signal path comprising a first amplifying circuit, wherein the first amplifying circuit is configured to receive the input signal via a first inverter input and to transmit a first amplified output via a first inverter output to the output terminal, a first feedback component is coupled between the first inverter input and the first inverter output, and the first amplified output includes first amplifier circuit harmonic noise,
a second signal path comprising a second amplifying circuit, wherein the second amplifying circuit is configured to receive the input signal via a second inverter input and to transmit a second amplified output via a second inverter output to the output terminal, a second feedback component is coupled between the second inverter input and the second inverter output, and the second amplified output includes second amplifier circuit harmonic noise,
wherein the output signal comprises the first and second amplified outputs, and wherein the first amplifying circuit harmonic noise is at least partially canceled by the second amplifying circuit harmonic noise in the output signal;
an analog-to-digital converter (ADC) configured to receive an analog signal based on the output signal of the LNA, and to generate a digital signal based on the received analog signal; and
a controller, configured to receive the digital signal.

14. The receiver of claim 13, wherein:
one or more first PMOS devices connected to the first inverter output;
one or more first NMOS devices connected to the first inverter output;
one or more second PMOS devices connected to the second inverter output;

one or more second NMOS devices connected to the second inverter output;

a transconductance per width of the first PMOS devices is different from a transconductance per width of the second PMOS devices; and a transconductance per width of the first NMOS devices is different from a transconductance per width of the second NMOS devices.

15. The receiver of claim 13, wherein:

one or more first PMOS devices connected to the first inverter output;

one or more first NMOS devices connected to the first inverter output;

one or more second PMOS devices connected to the second inverter output;

one or more second NMOS devices connected to the second inverter output;

a voltage difference between the drain and source of the first PMOS devices is different from a voltage difference between the drain and source of the second PMOS devices; and a voltage difference between the drain and source of the first NMOS devices is different from a voltage difference between the drain and source of the second NMOS devices.

* * * * *